United States Patent
Mueller et al.

(10) Patent No.: US 11,315,898 B2
(45) Date of Patent: Apr. 26, 2022

(54) METHOD FOR FASTENING A SEMICONDUCTOR CHIP ON A SUBSTRATE, AND ELECTRONIC COMPONENT

(71) Applicant: OSRAM OLED GmbH, Regensburg (DE)

(72) Inventors: Klaus Mueller, Pettendorf (DE); Andreas Ploessl, Regensburg (DE); Mathias Wendt, Hausen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/622,161

(22) PCT Filed: Jun. 6, 2018

(86) PCT No.: PCT/EP2018/064914
§ 371 (c)(1),
(2) Date: Dec. 12, 2019

(87) PCT Pub. No.: WO2018/228891
PCT Pub. Date: Dec. 20, 2018

(65) Prior Publication Data
US 2020/0211997 A1    Jul. 2, 2020

(30) Foreign Application Priority Data
Jun. 12, 2017 (DE) .......................... 102017112866.2

(51) Int. Cl.
*H01L 23/00* (2006.01)
(52) U.S. Cl.
CPC ............. *H01L 24/29* (2013.01); *H01L 24/83* (2013.01); *H01L 2224/29083* (2013.01);
(Continued)
(58) Field of Classification Search
CPC combination set(s) only.
See application file for complete search history.

(56) References Cited

U.S. PATENT DOCUMENTS

| 7,598,529 B2 | 10/2009 | Ploessl et al. |
| 9,337,396 B2 | 5/2016 | Katsuno et al. |

(Continued)

FOREIGN PATENT DOCUMENTS

| DE | 19532250 A1 | 3/1997 |
| DE | 19747846 A1 | 5/1999 |

(Continued)

OTHER PUBLICATIONS

Borzone, G., et al., "Phase Equilibria in the Au—In—Sn ternary system," CALPHAD, Computer Coupling of Phase Diagrams and Thermochemistry, 2009, pp. 17-22.

(Continued)

*Primary Examiner* — Dale E Page
*Assistant Examiner* — Wilner Jean Baptiste
(74) *Attorney, Agent, or Firm* — Slater Matsil, LLP (57) ABSTRACT

A method for fastening a semiconductor chip on a substrate and an electronic component are disclosed. In an embodiment a method includes providing a semiconductor chip, applying a solder metal layer sequence on the semiconductor chip, providing a substrate, applying a metallization layer sequence on the substrate, applying the semiconductor chip on the substrate via the solder metal layer sequence and the metallization layer sequence and heating the applied semiconductor chip on the substrate for fastening the semiconductor chip on the substrate. The solder metal layer may include a first metallic layer comprising an indium-tin alloy, a barrier layer arranged above the first metallic layer and a second metallic layer comprising gold arranged between the barrier layer and the semiconductor chip, wherein an amount of substance of the gold in the second metallic layer is greater than an amount of substance of tin in the first metallic layer.

19 Claims, 7 Drawing Sheets

(52) U.S. Cl.
CPC .............. *H01L 2224/29109* (2013.01); *H01L 2224/29111* (2013.01); *H01L 2224/29144* (2013.01); *H01L 2224/29155* (2013.01); *H01L 2224/29166* (2013.01); *H01L 2224/29169* (2013.01); *H01L 2224/83815* (2013.01)

(56) References Cited

U.S. PATENT DOCUMENTS

| | | | |
|---|---|---|---|
| 9,362,335 | B2 | 6/2016 | von Malm |
| 10,475,778 | B2 | 11/2019 | Pfeuffer et al. |
| 2003/0186476 | A1* | 10/2003 | Naydenkov ........ G02B 6/12004 438/26 |
| 2005/0194690 | A1 | 9/2005 | Ishii et al. |
| 2005/0212140 | A1 | 9/2005 | Fujinaga et al. |
| 2013/0037603 | A1* | 2/2013 | Choi ................... H01L 25/0657 228/203 |
| 2014/0008801 | A1 | 1/2014 | Chen et al. |
| 2014/0273318 | A1 | 9/2014 | Ryu et al. |
| 2016/0346857 | A1 | 12/2016 | Behr et al. |

FOREIGN PATENT DOCUMENTS

| | | |
|---|---|---|
| DE | 102015108545 A1 | 12/2016 |
| DE | 102015114086 A1 | 3/2017 |
| DE | 102017104276 A1 | 9/2018 |
| JP | 2006287226 A | 10/2006 |
| JP | 2014154727 A | 8/2014 |
| JP | 2015501085 A | 1/2015 |
| JP | 2016009811 A | 1/2016 |
| JP | 2018516460 A | 6/2018 |
| WO | 2016193071 A1 | 12/2016 |

OTHER PUBLICATIONS

Borzone, G., et al., "Phase Equilibria in the Au—In—Sn ternary system," CALPHAD: Computer Coupling of Phase Diagrams and Thermochemistry, 2009, pp. 18-22.

Huang, C.-Y., et al., "Interfacial Reactions in In—Sn/Ni Couples and Phase Equilibria of the In—Sn—Ni System," Journal of Electronic Materials, 2002, pp. 152-160, vol. 31, No. 2.

Massalski, T. B.,"Binary Alloy Phase Diagrams," The Materials Information Society, 1990, vol. 3, No. 2, 3 pages.

Schmid-Fetzer, R., "Fundamentals of Bonding by Isothermal Solidification for High Temperature Semiconductor Applicationns," Design Fundamental of High Temperature Composites, The Minerals, Metals and Materials Society, 1995, pp. 75-98, Frankfurt, Germany.

Yu, D., et al., "Wafer Level Hermetic Bonding using Sn/In and Cu/Ti/Au Metallization," 10th Electronics Packaging Technology Conference, 2008 IEEE, pp. 767-772.

\* cited by examiner

METHOD FOR FASTENING A SEMICONDUCTOR CHIP ON A SUBSTRATE, AND ELECTRONIC COMPONENT

This patent application is a national phase filing under section 371 of PCT/EP2018/064914, filed Jun. 6, 2018, which claims the priority of German patent application 102017112866.2, filed Jun. 12, 2017, each of which is incorporated herein by reference in its entirety.

TECHNICAL FIELD

The invention relates to a method for fastening a semiconductor chip on a substrate and an electronic component.

BACKGROUND

To connect a semiconductor chip to a substrate, such as a lead frame, semiconductor chips are often soldered on the substrate during the production of electronic components. Due to the difference in the thermal expansion behavior between the semiconductor chip and the material of the substrate, tensions arise during cooling from the soldering temperature to room temperature in the composite of semiconductor chip and substrate. These can lead to the initiation of cracks, for example, in the carrier material of the semiconductor chip, if the electronic component is subjected to mechanical load. For example, a gold-tin solder is used for soldering semiconductor chips onto a substrate. With this solder the soldering temperature is in the range of 300° C. Due to the high soldering temperature and the different thermal expansion behavior, considerable thermally induced mechanical loads occur during the cooling of the composite of substrate and semiconductor chip. If the component is subjected to further mechanical load, this can lead to failure of the solder joint or to the initiation of cracks in the substrate or the solder joint.

SUMMARY OF THE INVENTION

Embodiments provide a method for fastening a semiconductor chip on a substrate which is improved compared to the prior art. Further embodiments provide an electronic component.

According to an embodiment a method for fastening a semiconductor chip on a substrate is specified. The method comprises the following method steps, preferably in the specified order:

A) Providing a semiconductor chip.
B) Applying a solder metal layer sequence on the semiconductor chip.
C) Providing a substrate. The substrate is preferably a lead frame.
D) Applying a metallization layer sequence on the substrate.
E) Applying the semiconductor chip on the substrate via the solder metal layer sequence and the metallization layer sequence. In particular, the application is such that, after application, the metallization layer sequence and the solder metal layer sequence are located between the substrate and the semiconductor chip.
F) Heating the arrangement produced under E) for fastening the semiconductor chip on the substrate. In particular, in step F) the metallization layer sequence and the solder metal layer sequence form a bonding layer sequence.

That a layer or an element is arranged or applied "on" or "above" another layer or another element can mean here and below that the one layer or the one element is arranged directly in direct mechanical and/or electrical contact to the other layer or the other element. Furthermore, it can also mean that the one layer or the one element is arranged indirectly on or above the other layer or the other element. In this case, further layers and/or elements can then be arranged between the one or the other layer or between the one or the other element.

That a layer or an element is placed "between" two other layers or elements can mean here and below that the one layer or the one element is arranged directly in direct mechanical and/or electrical contact or in indirect contact with one of the other two layers or elements and in direct mechanical and/or electrical contact or in indirect contact with the other of the other two layers or elements. In the case of indirect contact, further layers and/or elements can then be arranged between the one and at least one of the other two layers or between the one and at least one of the other two elements.

According to at least one embodiment, the solder metal layer sequence comprises a first metallic layer, a barrier layer arranged above the first metallic layer, and a second metallic layer arranged between the barrier layer and the semiconductor chip. The solder metal layer sequence can also consist of the first metallic layer, the barrier layer and the second metallic layer.

According to at least one embodiment, the solder metal layer sequence comprises a first metallic layer comprising an indium-tin alloy, a barrier layer arranged above the first metallic layer, and a second metallic layer comprising gold arranged between the barrier layer and the semiconductor chip. Preferably, after method step E), the first metallic layer is arranged above the metallization layer sequence, the barrier layer is arranged above the first metallic layer and the second metallic layer is arranged above the barrier layer. Preferably, the first metallic layer consists of the indium-tin alloy. Preferably the second metallic layer consists of gold.

According to at least one embodiment, an indium-tin alloy can be applied to produce the second metallic layer, or indium and tin can be deposited separately. For example, first, a layer of tin is deposited, then a layer of indium is deposited and then again a layer of tin is deposited. Indium and tin already react at room temperature to form an alloy. In a separate deposition of the tin and the indium, an indium-tin alloy is formed at least partially, preferably completely, at room temperature and thus directly after the deposition. If the indium-tin alloy is only partially formed, in addition to this indium and tin can also be present in the second metallic layer. The second metallic layer can also consist of the indium-tin alloy or the indium-tin alloy and indium and tin.

According to at least one embodiment, the amount of substance of the gold in the second metallic layer is greater than the amount of substance of the tin in the first metallic layer. This has proven to be particularly advantageous for connecting the semiconductor chip to the substrate. Thus, a solid and permanent connection of the semiconductor chip can be ensured on the substrate in the resulting electronic component. In particular, in method step F), within the bonding layer sequence, a third intermetallic layer comprising at least one gold-tin alloy of the formula $Au_{1-y}Sn_y$ with $0.10 \leq y \leq 0.185$ is formed. The third intermetallic layer particularly preferably comprises a gold-tin alloy of the zeta ($\zeta$) phase. Thus, a third intermetallic layer is formed, in which the amount of substance of the gold is greater than the amount of substance of the indium. Such a third intermetallic layer has proven to be particularly advantageous in terms of its mechanical properties and is in particular more resilient, more ductile and significantly less brittle than gold-tin alloys with a higher tin content. For example, a gold-tin alloy of the zeta phase is significantly more resilient and more ductile than a gold-tin alloy of the delta (δ) phase.

The amount of substance denoted by n indirectly indicates the number of particles in a substance portion. The amount of substance n can be calculated from n=M/m, wherein M is the molar mass in g/mol and m is the weight in g. The amount of substance is known to a person skilled in the art.

According to at least one embodiment, the amount of substance of the gold in the second metallic layer is at least twice, preferably at least three or four times as large as the amount of substance of the tin in the first metallic layer. The amount of substance of the gold can be a maximum of seven times as large as the amount of substance of the tin.

According to at least one embodiment, the ratio of the amount of substance of material of the indium to the tin in the first metallic layer is between 0.04 to 0.96 inclusive and 0.2 to 0.8 inclusive, preferably between 0.06 to 0.94 inclusive and 0.18 to 0.82 inclusive, particularly preferably between 0.08 to 0.92 inclusive and 0.16 to 0.84 inclusive.

According to at least one embodiment, the indium-tin alloy of the second metallic layer has the formula $In_xSn_{1-x}$ with $0.04 \leq x \leq 0.2$, preferably $0.06 \leq x \leq 0.18$, particularly preferably $0.08 \leq x \leq 0.16$. The second metallic layer preferably consists of the indium-tin alloy of the formula $In_xSn_{1-x}$ with $0.04 \leq x \leq 0.2$. Such a composition of the indium-tin alloy has proven to be particularly advantageous. Due to the low indium content, the melting point decreases in comparison to pure tin, as a result of which the temperature in method step F) can be kept low. In addition, it can be ensured with a maximum indium content of x=0.2 that the indium-tin alloy does not melt before the semiconductor chip is applied to the substrate in optional further method steps. Surprisingly, it has also been shown that the wetting properties of the metallization layer sequence are best when the indium content does not exceed x=0.2.

The barrier layer is configured to first separate the metals of the first metallic layer, i.e., indium and tin, from the gold of the second metallic layer, since the indium-tin alloy with gold already produces a high-melting phase at room temperature. Therefore, the first and the second metallic layers may first be separated from one another. Even after the melting temperature of the indium-tin alloy has been reached, the liquid indium and the liquid tin or the liquid indium-tin alloy and the gold of the second metallic layer may be separated from one another in method step F). This is ensured by the barrier layer. The barrier layer can also be denoted as a temporary diffusion barrier. The barrier layer is preferably arranged above the entire surface between the first metallic layer and the second metallic layer. In particular, the first metallic layer and the second metallic layer have no common interface.

According to at least one embodiment, the barrier layer contains nickel, titanium or platinum. The nickel, titanium or platinum can be the metals or compounds of these metals. The titanium compound can be, for example, $Ti_yW_{y-1}$ or $Ti_zN_{z-1}$. The barrier layer preferably comprises or consists of the metals nickel, titanium or platinum, particularly preferably nickel or titanium. These metals or compounds are particularly advantageous because they react only slowly and with a time delay with the liquid indium and tin or the liquid indium-tin alloy after melting the indium-tin alloy in method step F), thus ensuring a sufficient wetting of the metallization layer sequence with the liquid indium and tin or the liquid indium-tin alloy.

According to at least one embodiment, the arrangement produced in method step E) is heated in method step F) up to a temperature of 240° C., preferably 200° C., particularly preferably 190° C. Even at these temperatures the indium-tin alloy melts. Due to this comparatively low soldering temperature, the mechanical loads induced during cooling of the substrate and semiconductor chip arrangement can be reduced, in particular compared to the use of a pure AuSn solder. As a result, a detachment of the semiconductor chip from the substrate is prevented under mechanical load and there are no or hardly any cracks under mechanical load.

The indium-tin alloy of the formula $In_xSn_{1-x}$ with $0.04 \leq x \leq 0.2$ can have a melting point between 190° C. and 225° C., in particular. The melting point describes the temperature at which the indium-tin alloy melts completely (liquidus temperature). In particular, the melting process can begin between a temperature of 170° C. and 200° C. (solidus temperature).

The use of an indium-tin alloy $In_xSn_{1-x}$ with $0.04 \leq x \leq 0.2$ reduces the melting temperature compared to pure tin. Even with an indium content of x=0.04, the melting temperature is 224° C., which is thus significantly lower than the melting temperature of pure tin, which is 232° C. The higher the indium content chosen, the lower the melting temperature, until the eutectic is reached at $Sn_{0.48}In_{0.52}$ and a melting temperature of about 121° C. The inventors have found in the present case that the melting temperature of the indium-tin alloy should not fall below 180° C., as otherwise there is a risk that it already melts in further processing steps of the semiconductor chip with applied solder metal layer sequence, such as laminating or separating processes, and reacts with the adjacent layers. This should be avoided, as otherwise a solid and permanent connection of the semiconductor chip to the substrate can no longer be ensured. By adding a small amount of indium to the tin with a ratio of indium to tin between 0.04 and 0.96 inclusive and 0.20 and 0.80 inclusive within the second metallic layer, on the one hand, the heating temperature in method step F) can be kept lower than in known soldering processes. This leads to a reduction of strain due to the difference in thermal expansion behavior between the material of the semiconductor chip and the material of the substrate. On the other hand, it can be ensured that the indium-tin alloy of the second metallic layer does not melt before the method step E) or F) and thus prematurely undergoes undesirable reactions with the adjacent layers.

When heated in method step F), the indium-tin alloy begins to melt. In this case, the surface of the metallization layer sequence is wetted with the liquid indium and the liquid tin or the liquid indium-tin alloy and reacts with the material of the metallization layer sequence. At the same time, the indium and the tin or the indium-tin alloy react with the material of the barrier layer, i.e., in particular nickel, titanium or platinum. Due to the existing barrier layer, a reaction of the indium and the tin or indium-tin alloy with the gold of the second metallic layer is initially delayed. This ensures that the metallization layer sequence is sufficiently wetted by the liquid indium and the liquid tin or indium-tin alloy. This would not be ensured if the indium and tin or the indium-tin alloy would immediately react with the gold of the second metallic layer, since this reaction would produce a refractory phase and the indium and tin or the indium-tin alloy would be liquid for an insufficient time to ensure a sufficient wetting of the metallization layer sequence and a reaction with the material of the metallization layer sequence. Surprisingly, the wetting is particularly good when the ratio of indium to tin in the second metallic layer is between 0.04 to 0.96 inclusive and 0.20 to 0.80 inclusive.

According to at least one embodiment, a second intermetallic layer comprising or consisting of indium, tin and the material of the barrier layer is formed in method step F) from the reaction of the indium and the tin or the indium-tin alloy with the material of the barrier layer, in particular nickel, titanium or platinum. At the same time, a first intermetallic layer is formed from the reaction of the indium and the tin or the indium-tin alloy with the material of the metallization layer sequence. In particular, the first metallic layer is arranged between the first and the second intermetallic layers. The remaining liquid indium and tin or the liquid indium-tin alloy diffuses through the second formed intermetallic layer into the second metallic layer and reacts with the gold to form a refractory solid phase, which is referred to here and below as the third intermetallic layer. The third intermetallic layer comprises or consists of indium, tin and gold. Due to the higher amount of substance of gold in the second metallic layer than the amount of substance of tin which is used according to embodiments of the invention, a third intermetallic layer is formed, in which the amount of substance of the gold is greater than the amount of substance of the indium.

According to at least one embodiment, a third intermetallic layer comprising at least one gold-tin alloy of the formula $Au_{1-y}Sn_y$ with $0.10 \leq y \leq 0.185$ is formed. A gold-tin alloy of the zeta phase is formed particularly preferably. In addition to the gold-tin alloy of the formula $Au_{1-y}Sn_y$ with $0.10 \leq y \leq 0.185$ or the gold-tin alloy of the zeta phase, further gold-tin alloys and/or gold-tin-indium alloys can be formed. A gold-tin alloy of the formula $Au_{1-y}Sn_y$ with $0.10 \leq y \leq 0.0185$ or a gold-tin alloy of the zeta phase is particularly preferred as the main component of the third intermetallic layer. In particular, the third intermetallic layer has no or almost no alloys which have a melting point below 280° C. Such a third intermetallic layer has proven to be particularly advantageous in terms of its mechanical properties and is in particular more resilient, ductile and significantly less brittle than a gold-tin alloy with a higher tin content or a lower gold content. An electronic component produced by this method is therefore particularly robust against mechanical stress.

According to at least one embodiment, a method step G) takes place after method step F): G) Temper the assembly produced under F) at a temperature between 200° C. and 260° C. inclusive. The tempering can preferably be carried out for 1 hour to eight hours. By the tempering, the formation of compounds or alloys with a melting point below 280° C. within the third intermetallic layer can be effectively prevented.

According to at least one embodiment, a bonding layer sequence is formed between the substrate and the semiconductor chip in method step F). The semiconductor chip is fastened on the substrate via the bonding layer sequence. The bonding layer sequence comprises a first intermetallic layer, a second intermetallic layer and a third intermetallic layer.

According to at least one embodiment, the first intermetallic layer is arranged above the substrate, the second intermetallic layer is arranged above the first intermetallic layer and the third intermetallic layer is arranged above the second intermetallic layer.

According to at least one embodiment, the metallization layer sequence comprises a first layer comprising or consisting of nickel arranged above the substrate. The metallization layer sequence can also consist of the first layer. The first intermetallic layer formed in method step F) can comprise or consist of indium, tin and nickel according to this embodiment. According to this embodiment, the first and the second intermetallic layers can contain or consist of indium, tin and nickel.

According to at least one embodiment, the metallization layer sequence comprises a first layer comprising nickel arranged above the substrate and a second layer comprising palladium arranged above the first layer. The second layer can also consist of palladium.

According to at least one embodiment, the metallization layer sequence comprises a third layer comprising gold arranged above the first or the second layer. The third layer can also consist of gold.

According to at least one embodiment, the metallization layer sequence consists of the first layer and the third layer or of the first layer, the second layer and the third layer.

According to at least one embodiment, the semiconductor chip is applied to the substrate in method step E) in such a way that the first metallic layer of the solder metal layer sequence is applied to the third layer of the metallization layer sequence. The first intermetallic layer formed in step F) can comprise or consist of indium, tin, gold, palladium and nickel according to this embodiment.

According to at least one embodiment, the barrier layer has a thickness between 5 nm and 200 nm inclusive. With these layer thicknesses, a sufficient delay of the reaction of the indium and the tin or the indium-tin alloy with the gold of the second metallic layer can be ensured in order to wet the metallization layer sequence sufficiently with the liquid indium-tin alloy.

According to at least one embodiment, the first metallic layer has a thickness between 750 nm and 3 μm inclusive.

In particular, the layer thicknesses of the individual layers of the solder metal layer sequence and the metallization layer sequence are matched to one another in such a way that in method step F) the indium and the tin or the indium-tin alloy react as completely as possible and it is ensured that the liquid indium-tin alloy reacts with the gold of the second metallic layer of the solder metal layer sequence and the nickel of the first layer of the metallization layer sequence. Thus, after method step F), the first intermetallic layer, the second intermetallic layer and the third intermetallic layer are preferably located between the semiconductor chip and the substrate.

According to at least one embodiment, the second metallic layer of the solder metal layer sequence has a layer thickness between 500 nm and 2 μm inclusive.

According to at least one embodiment, the first layer of the metallization layer sequence has a layer thickness between 2 μm and 4 μm inclusive, for example, 3 μm.

According to at least one embodiment, the second layer of the metallization layer sequence has a layer thickness between 10 nm and 20 nm inclusive.

According to at least one embodiment, the solder metal layer sequence comprises an oxidation protection layer comprising gold and a second barrier layer. In this case, the first metallic layer is arranged above the second barrier layer and the second barrier layer is arranged above the oxidation protection layer. The oxidation protection layer serves to protect the first metallic layer from oxidation. An oxidation or partial oxidation of the indium and/or the tin leads to a poor wetting of the metallization layer sequence and should therefore be avoided. In particular, indium is highly sensitive to oxidation. This embodiment is particularly preferred if the semiconductor chip comprising the solder metal layer sequence is stored for a certain period of time prior to application on the substrate, i.e., before method step E).

According to at least one embodiment, the second barrier layer contains nickel, titanium or platinum. The nickel, titanium or platinum can be the metals or compounds of these metals. The titanium compound can be $Ti_yW_{y-1}$ or $Ti_zN_{z-1}$. The second barrier layer preferably comprises or consists of the metals nickel, titanium or platinum, particularly preferred titanium. The second barrier layer serves to prevent a reaction between the indium-tin alloy and the gold of the oxidation protection layer at room temperature and in particular during storage of the semiconductor chip. The metals or compounds of the second barrier layer react only slowly with the indium-tin alloy in method step F). However, to ensure a sufficient wetting of the metallization layer sequence with the liquid indium-tin alloy, the second barrier layer preferably has a significantly lower layer thickness than the barrier layer. In order to ensure a sufficient wetting of the metallization layer sequence in method step F), the second barrier layer in particular has a layer thickness between 3 nm and 10 nm inclusive, preferably between and 5 nm and 10 nm inclusive. According to this embodiment, the barrier layer can in particular have a layer thickness between 20 nm and 200 nm.

According to at least one embodiment, the oxidation protection layer has a thickness between 50 nm and 100 nm inclusive. Below 50 nm, it is not sufficiently dense to ensure a sufficient protection of the first metallic layer from oxidation. A layer thickness above 100 nm should be avoided in order to ensure a sufficient wetting of the metallization layer sequence.

When heated in method step F), the indium-tin alloy begins to melt. In this case, it first reacts with the material of the second barrier layer, thus, in particular, nickel, titanium or platinum, and subsequently with the gold of the oxidation protection layer. Subsequently, the metallization layer sequence is wetted by the liquid indium-tin alloy. In order to ensure a sufficient wetting, this may take place before the reaction of the indium-tin alloy with the gold of the second metallic layer begins. This can be done in particular by the choice of the layer thickness of the second barrier layer, the oxidation protection layer and the barrier layer. The barrier layer particularly preferably has a layer thickness between 20 nm and 200 nm inclusive or 100 nm inclusive, the second barrier layer a layer thickness between 5 nm and 10 nm inclusive and the oxidation protection layer a layer thickness between 50 nm and 100 nm inclusive.

According to at least one embodiment, a second intermetallic layer comprising or consisting of indium, tin and the material of the barrier layer is formed in method step F) from the reaction of indium and tin or the indium-tin alloy with the material of the barrier layer, in particular nickel, titanium or platinum. At the same time, a first intermetallic layer is formed from the reaction of indium and tin or the indium-tin alloy with the material of the second barrier layer, the gold of the oxidation protection layer and the metallization layer sequence. In particular, the first metallic layer is additionally arranged between the first and the second intermetallic layer. The remaining liquid indium and tin or the liquid indium-tin alloy diffuses through the second formed intermetallic layer into the second metallic layer and reacts with the gold to form a refractory solid phase, forming the third intermetallic layer. The third intermetallic layer comprises or consists of indium, tin and gold.

According to at least one embodiment, the third layer of the metallization layer sequence has a layer thickness between 3 nm and 5 nm inclusive. The third layer should not exceed a layer thickness of 5 nm to ensure that the refractory phase formed from the indium-tin alloy with gold does not become too thick and thus it can still be ensured that the liquid indium-tin alloy gets through to the nickel of the first layer of the metallization layer sequence and reacts with it.

According to at least one embodiment, the substrate, in particular the lead frame, can comprise copper. The semiconductor chip can be electrically contacted via the lead frame.

According to at least one embodiment, the semiconductor chip is a layer sequence with an active layer configured to emit electromagnetic radiation.

In this context, "layer sequence" means a layer sequence comprising more than one layer, for example, a sequence of a p-doped and an n-doped semiconductor layer, wherein the layers are arranged one above the other and wherein at least one active layer emitting electromagnetic radiation is included.

The layer sequence can be formed as an epitaxial layer sequence or a radiation-emitting semiconductor chip with an epitaxial layer sequence, i.e., an epitaxially grown semiconductor layer sequence. The layer sequence can be formed on the basis of InGaAlN, for example. InGaAlN-based semiconductor chips and semiconductor layer sequences are in particular those in which the epitaxially produced semiconductor layer sequence has a layer sequence of different individual layers, which contains at least one individual layer which has a material from the III-V compound semiconductor material system $In_xAl_yGa_{1-x-y}N$ with $0 \leq x \leq 1$, $0 \leq y \leq 1$ and $x+y \leq 1$. Semiconductor layer sequences that have at least one active layer based on InGaAlN can emit electromagnetic radiation in an ultraviolet to blue wavelength range, for example.

In addition to the active layer, the active semiconductor layer sequence can include further functional layers and functional areas, such as p- or n-doped charge carrier transport layers, i.e., electron or hole transport layers, undoped or p- or n-doped confinement, cladding or waveguide layers, barrier layers, planarization layers, buffer layers, protective layers and/or electrodes as well as combinations thereof. Furthermore, one or more mirror layers can be applied on a side of the semiconductor layer sequence facing away from the growth substrate. The structures described here, concerning the active layer or the further functional layers and areas, are known to the person skilled in the art, in particular with regard to their composition, function and structure and are therefore not explained in detail here.

According to an embodiment an electronic component is specified. The electronic component is preferably produced by one of the processes specified in connection with one or more of the abovementioned embodiments. All features disclosed for the method are therefore also disclosed for the component and vice versa.

According to at least one embodiment, the component is an optoelectronic component for generating radiation or light.

According to an embodiment an electronic component comprising a substrate and a semiconductor chip arranged above the substrate is specified. A bonding layer sequence is arranged between the semiconductor chip and the substrate. In particular, the semiconductor chip is fastened on the substrate via the bonding layer sequence.

According to at least one embodiment, the bonding layer sequence comprises a first intermetallic layer, a second intermetallic layer and a third intermetallic layer. In particular, the first intermetallic layer is arranged above the substrate, the second intermetallic layer is arranged above the first intermetallic layer and the third intermetallic layer is arranged above the second intermetallic layer. The bonding layer sequence can also consist of the first, the second and the third intermetallic layers.

According to at least one embodiment, a first layer comprising or consisting of nickel is arranged between the substrate and the bonding layer sequence, in particular between the substrate and the first intermetallic layer.

According to at least one embodiment, the first intermetallic layer of the bonding layer sequence comprises tin, indium and nickel; tin, indium, nickel and palladium; tin, indium, nickel, palladium and gold or tin, indium, nickel and gold, or consists of these metals.

According to at least one embodiment, the first intermetallic layer of the bonding layer sequence comprises tin, indium, gold and nickel; tin, indium, nickel, gold and palladium; tin, indium, nickel, palladium and gold or tin, indium, nickel and gold, or consists of these metals. This embodiment is preferred if the solder metal layer sequence comprises a second barrier layer comprising nickel and an oxidation protection layer.

According to at least one embodiment, the first intermetallic layer of the bonding layer sequence comprises tin, indium, gold, titanium and nickel; tin, indium, gold, titanium, nickel and palladium; tin, indium, gold, titanium, nickel and palladium or tin, indium, nickel, gold and titanium, or consists of these metals. This embodiment is preferred if the solder metal layer sequence comprises a second barrier layer comprising titanium and an oxidation protection layer.

According to at least one embodiment, the first intermetallic layer of the bonding layer sequence comprises tin, indium, gold, platinum and nickel; tin, indium, gold, platinum, nickel and palladium; tin, indium, gold, platinum, nickel and palladium or tin, indium, nickel, gold and platinum, or consists of these metals. This embodiment is preferred if the solder metal layer sequence comprises a second barrier layer comprising platinum and an oxidation protection layer.

According to at least one embodiment, the first intermetallic layer of the bonding layer sequence comprises tin, indium, gold, a titanium compound and nickel; tin, indium, gold, a titanium compound, nickel and palladium; tin, indium, gold, a titanium compound, nickel and palladium or tin, indium, nickel, gold and a titanium compound, or consists of these metals. This embodiment is preferred if the solder metal layer sequence comprises a second barrier layer comprising a titanium compound and an oxidation protection layer.

According to at least one embodiment, the second intermetallic layer comprises tin, indium and a titanium compound; tin, indium and nickel; tin, indium and platinum or tin, indium and titanium or consists of tin, indium and a titanium compound; tin, indium and nickel; tin, indium and platinum or platinum, indium and titanium.

According to at least one embodiment, the third intermetallic layer of the bonding layer sequence comprises indium, tin and gold, or consists of these metals. In particular, the amount of substance of the gold is greater than the amount of substance of the tin.

According to at least one embodiment, the third intermetallic layer comprises at least one gold-tin alloy of the formula $Au_{1-y}Sn_y$ with $0.10 \leq y \leq 0.185$. A gold-tin alloy of the zeta phase is particularly preferentially formed. In addition to the gold-tin alloy of the formula $Au_{1-y}Sn_y$ with $0.10 \leq y \leq 0.185$ or the gold-tin alloy of the zeta phase, further gold-tin alloys and/or gold-tin-indium alloys can be comprised in the third intermetallic layer. A gold-tin alloy of the formula $Au_{1-y}Sn_y$ with $0.10 \leq y \leq 0.185$ or a gold-tin alloy of the zeta phase is particularly preferred as the main component of the third intermetallic layer. Such a third intermetallic layer has proven to be particularly advantageous in terms of its mechanical properties and is in particular more resilient, ductile and significantly less brittle than a gold-tin alloy with a higher tin content or a lower gold content. This makes the electronic component particularly stable against mechanical loads.

According to at least one embodiment, an adhesive layer is arranged between the semiconductor chip and the bonding layer sequence. The adhesive layer can be one or more metallic layers. For example, the metal can be selected from a group comprising platinum, titanium and gold.

According to at least one embodiment, the semiconductor chip is arranged on a substrate. The substrate can, for example, be a sapphire substrate.

According to at least one embodiment, the semiconductor chip is arranged on a carrier. The carrier can, for example, be a carrier comprising or consisting of silicon.

BRIEF DESCRIPTION OF THE DRAWINGS

Further advantages, advantageous embodiments and further developments will become apparent from the exemplary embodiments described in the following in connection with the Figures. Identical, similar or equivalent elements are provided with the same reference signs. The Figures and the proportions of the elements shown in the Figures are not to be regarded as true to scale. Rather, individual elements can be shown exaggeratedly large or simplified for better representability and/or better comprehensibility.

DETAILED DESCRIPTION OF ILLUSTRATIVE EMBODIMENTS

Figure 1A:
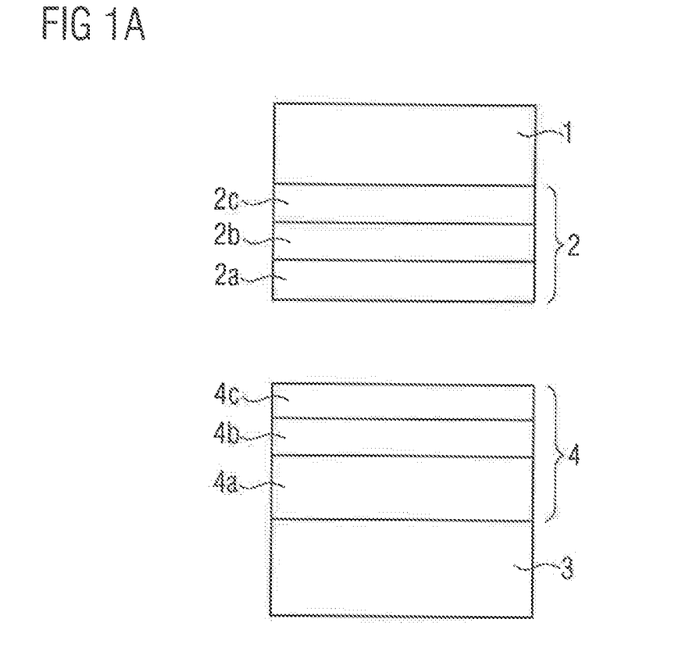
FIGS. 1A to 1D and 2A to 2D schematically show a method for producing an electronic component.

FIG. 1A shows a semiconductor chip 1 above which a solder metal layer sequence 2 is arranged. The solder metal layer sequence comprises a first metallic layer 2a, a barrier layer 2b arranged above the first metallic layer 2a and a second metallic layer 2c arranged above the barrier layer 2b. The first metallic layer 2a comprises or consists of an indium-tin alloy of the formula $In_xSn_{1-x}$ with $0.04 \leq x \leq 0.2$. The barrier layer 2b consists of nickel, titanium or platinum and the second metallic layer 2c consists of gold. The amount of substance of the gold of the second metallic layer 2c is greater than the amount of substance of the tin of the first metallic layer 2a. The first metallic layer 2a has a layer thickness between 750 nm and 3 µm inclusive, the barrier layer has a layer thickness between 5 nm and 200 nm inclusive and the second metallic layer 2c has a layer thickness between 500 nm and 2 µm inclusive. Further, FIG. 1A shows a substrate 3 above which a metallization layer sequence 4 is arranged. The metallization layer sequence 4 consists of a first layer 4a comprising or consisting of nickel arranged above the substrate 3, a second layer 4b comprising or consisting of palladium arranged above the first layer 4a and a third layer 4c comprising or consisting of gold arranged above the second layer 4b. In this case, the first layer 4a has a layer thickness of, for example, 3 µm. The second layer 4b has a layer thickness between 10 nm and 20 nm inclusive, and the third layer 4c has a layer thickness between 3 nm and 5 nm inclusive. In particular, the substrate 3 is a lead frame.

Figure 1B:
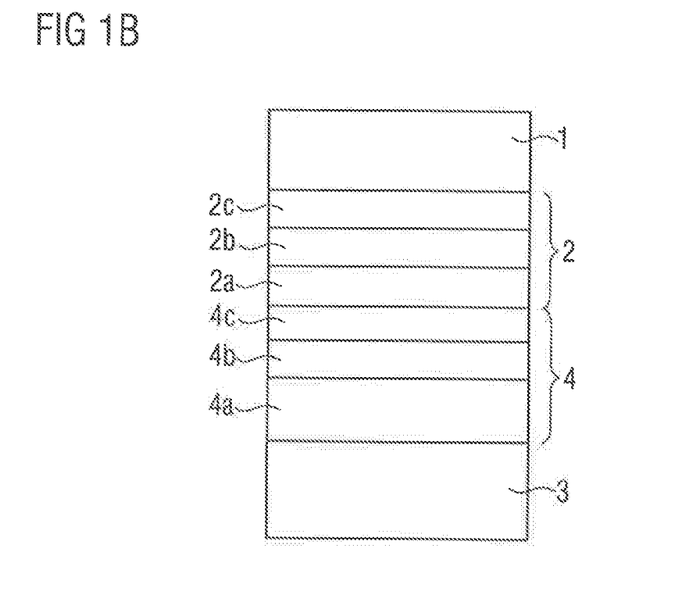

FIG. 1B shows an arrangement in which the semiconductor chip 1 is arranged on the substrate 3 via the solder metal layer sequence 2 and the metallization layer sequence 4.

Figure 1C:
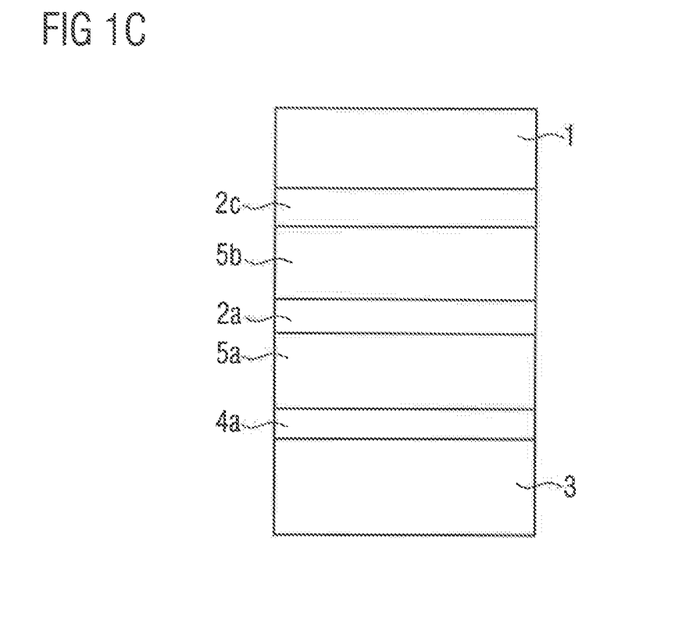

By heating the arrangement shown in FIG. 1B to a temperature of about 200° C., the indium-tin alloy melts in the first metallic layer 2a. The liquid indium-tin alloy wets the third layer 4c of the metallization layer sequence 4. The liquid indium-tin alloy reacts with the nickel, platinum or titanium of the barrier layer 2b and forms a second intermetallic layer 5b, as shown in FIG. 1C. At the same time the liquid indium or the liquid indium-tin alloy reacts with the gold of the third layer 4c, the palladium of the second layer 4b and the nickel of the first layer 4a and forms a first intermetallic layer 5a. In this case, as shown, the nickel of the first layer 4a cannot completely react with the liquid indium-tin alloy, so that a first layer 4a with a reduced layer thickness remains. However, it is also possible that the nickel reacts completely with the liquid indium-tin alloy and thus no layer 4a is present anymore.

Figure 1D:
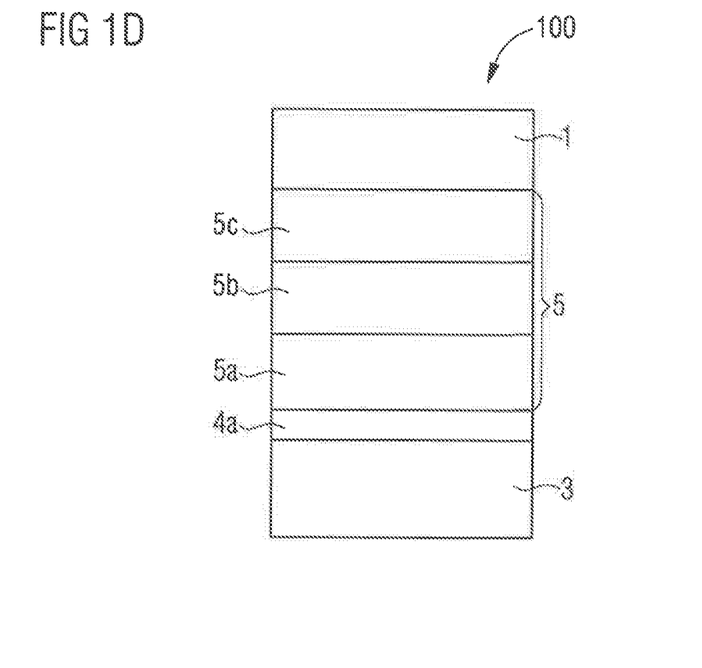

The liquid indium-tin alloy remaining in the first metallic layer 4a diffuses through a grain boundary diffusion through the second intermetallic layer 5b to the second metallic layer 2c, where it reacts with the gold to form a third intermetallic layer 5c (see FIG. 1D). The third intermetallic layer comprises at least one gold-tin alloy of the formula $Au_{1-y}Sn_y$ with $0.10 \leq y \leq 0.185$, preferably a gold-tin alloy of the zeta phase. As a result, the electronic component produced by the method is particularly stable against mechanical load.

The electronic component 100 shown in FIG. 1D, in particular an optoelectronic component 100, comprises a substrate 3, a first layer 4a arranged above the substrate 3, comprising or consisting of nickel. A bonding layer sequence 5 is arranged above the first layer. The bonding layer sequence 5 comprises a first intermetallic layer 5a, a second intermetallic layer 5b arranged above the first intermetallic layer 5a, and a third intermetallic layer 5c arranged above the second intermetallic layer 5b. The semiconductor chip 1 is fastened on the substrate 3 via the bonding layer sequence 5.

Figure 2A:
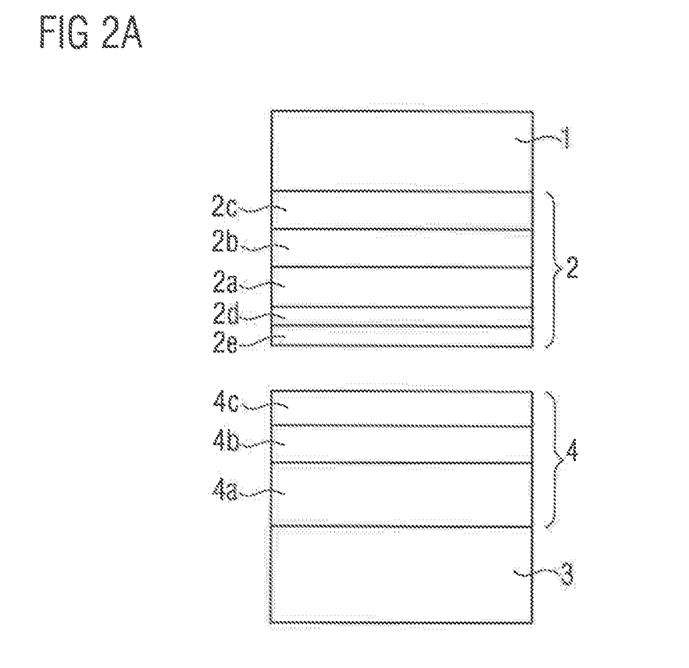

FIG. 2A shows a semiconductor chip 1 above which a solder metal layer sequence 2 is arranged. The solder metal layer sequence 2 consists of an oxidation protection layer 2e, a second barrier layer 2d arranged above the oxidation protection layer 2e, a first metallic layer 2a arranged above the second barrier layer 2d, a barrier layer 2b arranged above the first metallic layer 2a, and a second metallic layer 2c arranged above the barrier layer 2b. The oxidation protection layer 2e consists of gold and has a layer thickness between 50 nm and 100 nm inclusive. The second barrier layer 2d consists of nickel, titanium or platinum and has a layer thickness between 3 nm and 10 nm inclusive. The first metallic layer 2a comprises or consists of an indium-tin alloy of the formula $In_xSn_{1-x}$ with $0.04 \leq x \leq 0.2$. The barrier layer 2b consists of nickel, titanium or platinum and the second metallic layer 2c consists of gold. The amount of substance of the gold of the second metallic layer 2c is greater than the amount of substance of the tin of the first metallic layer 2a. The first metallic layer 2a has a layer thickness between 750 nm and 3 µm inclusive, the barrier layer has a layer thickness between 20 nm and 200 nm inclusive and the second metallic layer 2c has a layer thickness between 500 nm and 2 m inclusive. Due to the oxidation protection layer 2e of gold the first metallic layer 2a is protected against the penetration of air and moisture and thus against unwanted oxidation. This makes the semiconductor chip 1, on which the solder metal layer sequence is applied, storable. The oxidation protection layer 2e is separated from the first metallic layer 2a by a second barrier layer 2d in order to prevent a reaction of the gold of the oxidation protection layer 2e with the indium-tin alloy of the first metallic layer 2a already at room temperature, in particular before the application of the semiconductor chip 1 on the substrate 3. Furthermore, FIG. 2A shows a substrate 3, in particular formed as a lead frame, above which a metallization layer sequence 4 is arranged. The metallization layer sequence 4 consists of a first layer 4a comprising or consisting of nickel arranged above the substrate 3, a second layer 4b comprising or consisting of palladium arranged above the first layer 4a and a third layer 4c comprising or consisting of gold arranged above the second layer 4b. In this case, the first layer 4a has a layer thickness of, for example, 3 µm. The second layer 4b has a layer thickness between 10 nm and 20 nm inclusive and the third layer 4c has a layer thickness between 3 nm and 5 nm inclusive.

Figure 2B:
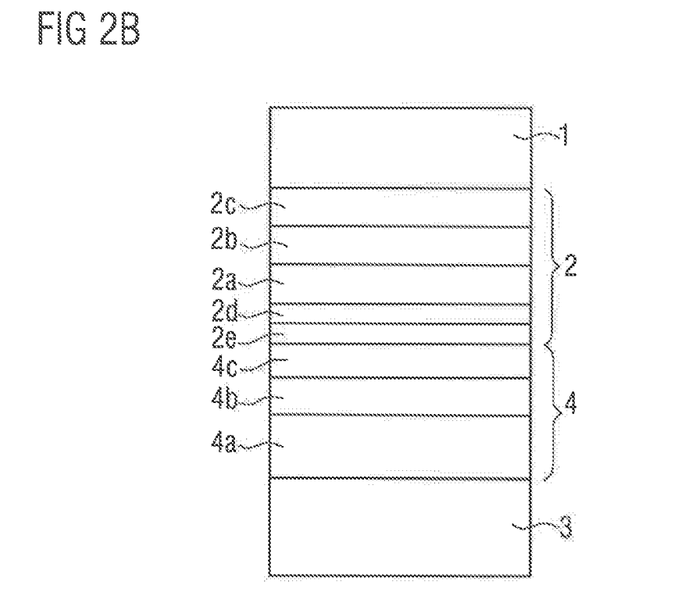

FIG. 2B shows an arrangement in which the semiconductor chip 1 is arranged on the substrate 3 via the solder metal layer sequence 2 and the metallization layer sequence 4. In this case, the oxidation protection layer 2e of the solder metal layer sequence 2 is arranged above the third layer 4c of the metallization layer sequence 4.

Figure 2C:
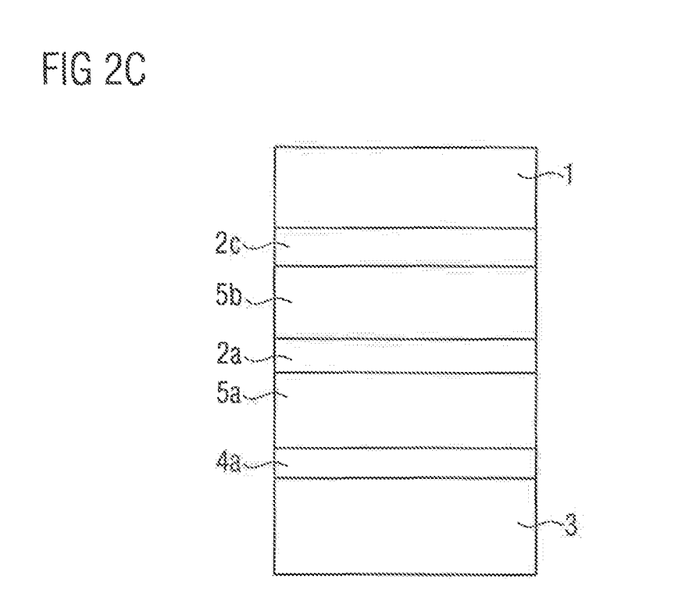

By heating the arrangement shown in FIG. 2B to a temperature of about 200° C., the indium-tin alloy melts in the first metallic layer 2a. The liquid indium-tin alloy reacts with the nickel, platinum or titanium of the second barrier layer 2d, the gold of the oxidation protection layer 2e and wets the third layer 4c of the metallization layer sequence 4. The liquid indium-tin alloy reacts with the nickel, platinum or titanium of the barrier layer 2b and forms, as shown in FIG. 2C, a second intermetallic layer 5b. At the same time, the liquid indium-tin alloy reacts with the gold of the third layer 4c, the palladium of the second layer 4b and the nickel of the first layer 4a and forms a first intermetallic layer 5a. In this case, as shown, the nickel of the first layer 4a cannot completely react with the liquid indium-tin alloy, so that a first layer 4a with a reduced layer thickness remains. However, it is also possible that the nickel reacts completely with the liquid indium-tin alloy and thus no layer 4a is present anymore.

Figure 2D:
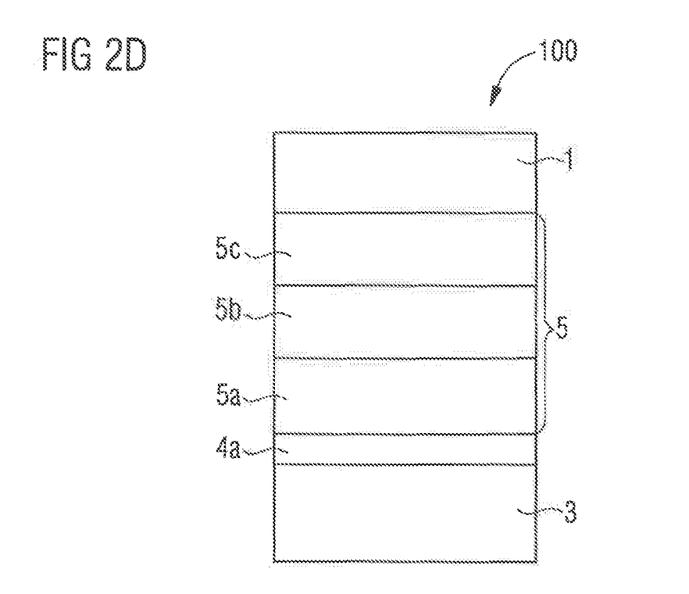

The liquid indium-tin alloy remaining in the first metallic layer 4a diffuses through a grain boundary diffusion through the second intermetallic layer 5b to the second metallic layer 2c, where it reacts with the gold to form a third intermetallic layer 5c (see FIG. 2D). In this case, a gold-tin alloy of the formula $Au_{1-y}Sn_y$ is formed with $0.10 \leq y \leq 0.185$, preferably a gold-tin alloy of the zeta phase.

The electronic component 100 shown in FIG. 2D, in particular an optoelectronic component 100, comprises a substrate 3, a first layer 4a arranged above the substrate 3, comprising or consisting of nickel. A bonding layer sequence 5 is arranged above the first layer. The bonding layer sequence 5 comprises a first intermetallic layer 5a, a second intermetallic layer 5b arranged above the first intermetallic layer 5a, and a third intermetallic layer 5c arranged above the second intermetallic layer 5b. The semiconductor chip 1 is fastened on the substrate 3 via the bonding layer sequence 5.

Figure 3:
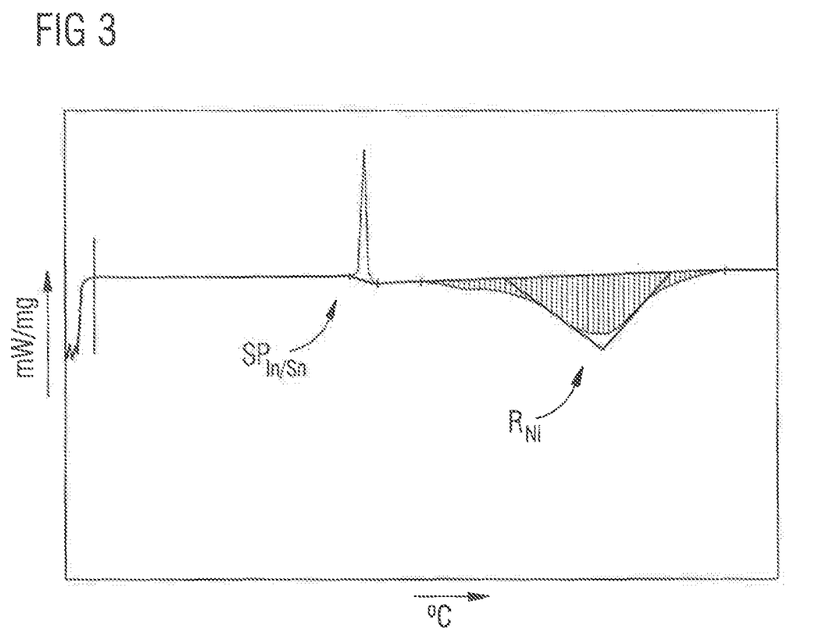
FIGS. 3 and 4 show dynamic differential calorimetry diagrams.
Figure 4:
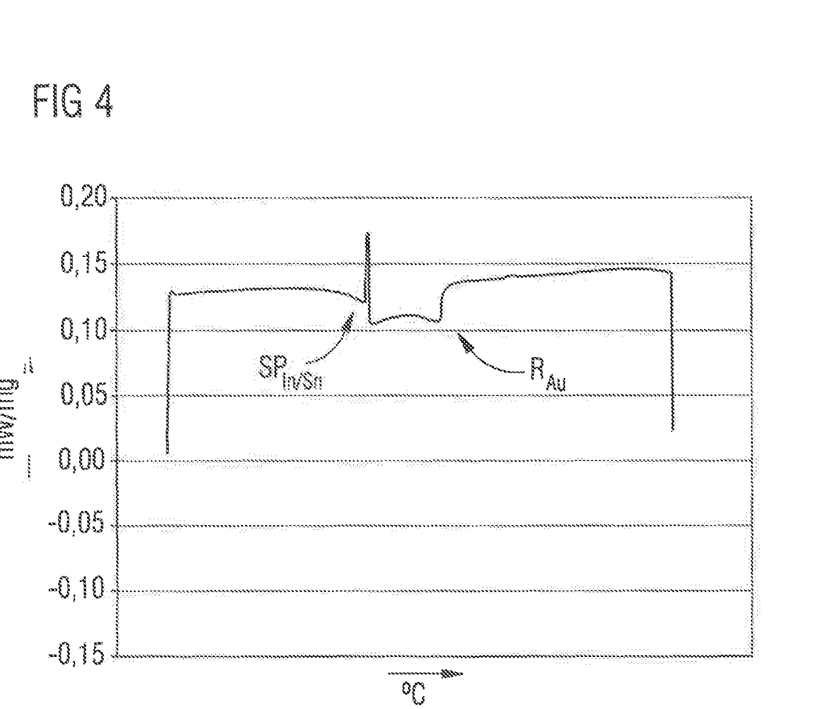

FIGS. 3 and 4 show dynamic differential calorimetry diagrams. The temperature in ° C. is indicated on the x-axis and mW/mg on the y-axis.

FIG. 3 shows the dynamic differential calorimetry diagram of the reaction of an indium-tin alloy $In_xSn_{1-x}$ with $0<x\leq 1$ with nickel. $SP_{In/Sn}$ denotes the melting point of the indium-tin alloy and $R_{Ni}$ the reaction of the liquid indium-tin alloy with nickel. As can be seen, the reaction with the nickel takes place very slowly and does not occur immediately after reaching the melting temperature. For this reason, nickel is particularly suitable for being used in the barrier layer, as this ensures that the metallization layer sequence is sufficiently wetted with the liquid indium-tin alloy.

FIG. 4 shows the dynamic differential calorimetry diagram of the reaction of an indium-tin alloy $In_xSn_{1-x}$ with $0<x\leq 1$ with gold. $SP_{In/Sn}$ denotes the melting point of the indium-tin alloy and $R_{Ni}$ the reaction of the liquid indium-tin alloy with gold. As can be seen, the reaction of the gold occurs immediately after the indium-tin alloy has melted and the existing barrier is broken. Thus, when using a too thin or no barrier layer, the metallization layer sequence cannot or not sufficiently be wetted because the indium-tin alloy previously solidifies to form a refractory phase with the gold of the second metallic layer, before wetting and reaction takes place with the metals of the metallization layer sequence.

Figure 5:
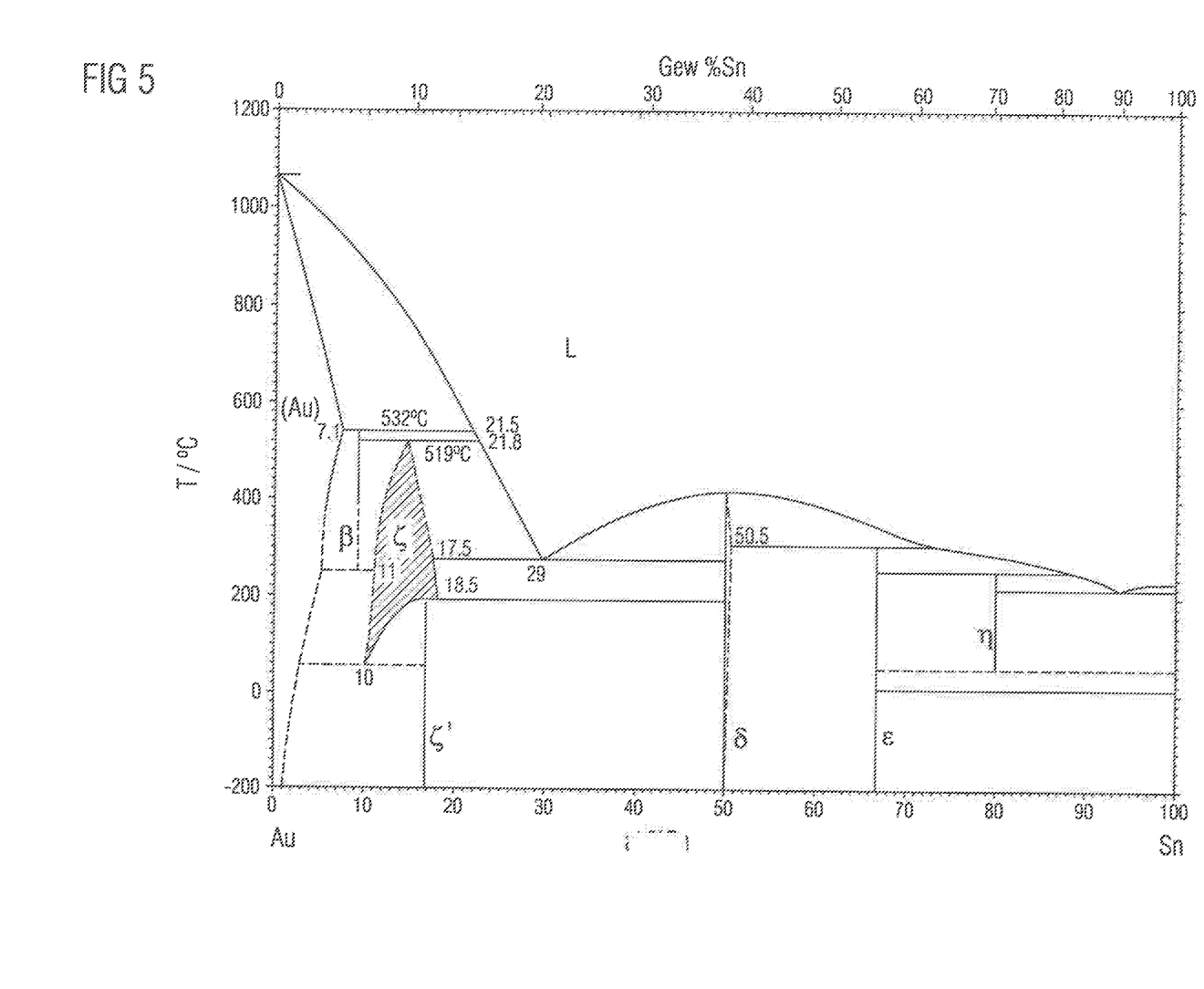
FIG. 5 shows a phase diagram of indium-tin alloys.

FIG. 5 shows a phase diagram of gold-tin alloys. On the x-axis the proportion of tin is plotted in atomic percent (at %) or in weight percent (wt %) and on the y-axis the temperature (T). As can be seen, the gold-tin alloy of the zeta (ζ) phase (shaded area) forms from a tin content of 10 atomic percent to 18.5 atomic percent and thus has the formula $Au_{1-y}Sn_y$ with $0.10\leq y\leq 0.185$.

Figure 6:
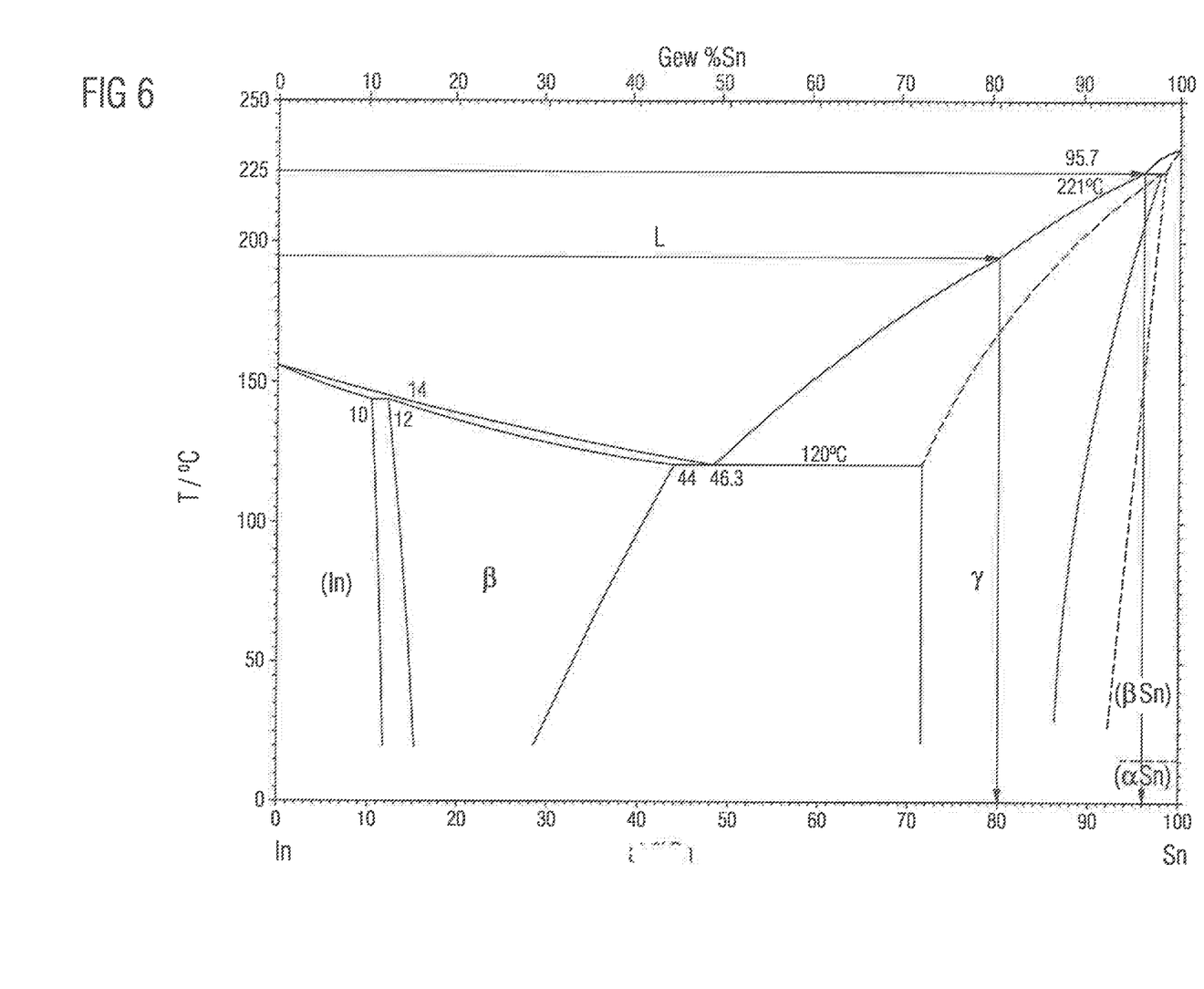
FIG. 6 shows a phase diagram of gold-tin alloys.

FIG. 6 shows a phase diagram of indium-tin alloys. On the x-axis the amount of tin is plotted in atomic percent (at %) or in percentage by weight (wt %) and on the y-axis the temperature (T). Indium-tin alloys with a tin content of between 4 and 20 atomic percent, which thus have the formula $In_xSn_{1-x}$ with $0.04\leq x\leq 0.2$, have a melting point of between about 190° C. and 225° C., which has proved to be particularly advantageous for carrying out the method according to embodiments of the invention.

The invention described here is not limited by the description on the basis of the exemplary embodiments. Rather, the invention comprises each new feature as well as each combination of features, which in particular comprises each combination of features in the patent claims, even if this feature or this combination itself is not explicitly mentioned in the patent claims and exemplary embodiments.

The invention claimed is:

1. A method comprising:
providing a semiconductor chip;
applying a solder metal layer sequence on the semiconductor chip;
providing a substrate;
applying a metallization layer sequence on the substrate;
applying the semiconductor chip on the substrate via the solder metal layer sequence and the metallization layer sequence; and
heating the applied semiconductor chip on the substrate for fastening the semiconductor chip on the substrate, the solder metal layer sequence comprising:
a first metallic layer comprising an indium-tin alloy;
a barrier layer arranged above the first metallic layer; and
a second metallic layer comprising gold arranged between the barrier layer and the semiconductor chip, wherein an amount of substance of the gold in the second metallic layer is greater than an amount of substance of tin in the first metallic layer.

2. The method according to claim 1, wherein the amount of substance of the gold in the second metallic layer is at least twice as large as the amount of substance of the tin in the first metallic layer.

3. The method according to claim 1, wherein the metallization layer sequence comprises a first layer comprising nickel arranged above the substrate.

4. The method according to claim 1, wherein the barrier layer comprises nickel, titanium, platinum or a titanium compound.

5. The method according to claim 1, wherein a bonding layer sequence formed between the substrate and the semiconductor chip comprises:
a first intermetallic layer comprising indium, tin and nickel;
a second intermetallic layer comprising indium, tin and nickel, or indium, tin and titanium, or indium, tin and a titanium compound, or indium, tin and platinum; and
a third intermetallic layer comprising indium, tin and gold.

6. The method according claim 1, wherein the metallization layer sequence comprises a first layer comprising nickel arranged above the substrate, a second layer comprising palladium arranged above the first layer, and a third layer comprising gold arranged above the second layer.

7. The method according to claim 6, wherein applying the semiconductor chip on the substrate comprising applying the semiconductor chip such that the first metallic layer of the solder metal layer sequence is applied on the third layer of the metallization layer sequence.

8. The method according to claim 1, wherein the barrier layer has a layer thickness between 5 nm and 200 nm inclusive.

9. The method according to claim 1, wherein the indium-tin alloy has the following formula: $In_xSn_{1-x}$ with $0.04\leq x\leq 0.2$.

10. The method according to claim 1, wherein the first metallic layer has a layer thickness between 750 nm and 3 μm inclusive.

11. The method according to claim 1, wherein the second metallic layer has a layer thickness between 500 nm and 2 μm inclusive.

12. The method according to claim 1, wherein the solder metal layer sequence comprises an oxidation protection layer comprising gold and a second barrier layer, wherein the first metallic layer is arranged above the second barrier layer, and wherein the second barrier layer is arranged above the oxidation protection layer.

13. The method according to claim 1, wherein the semiconductor chip comprises a carrier comprising silicon.

14. The method according to claim 1, wherein the second metallic layer comprises the indium-tin alloy of the formula $In_xSn_{1-x}$ with $0.04\leq x\leq 0.2$.

15. The method according to claim 1, wherein the barrier layer comprises $Ti_yW_{y-1}$ or $Ti_zN_{z-1}$, and wherein $0\leq y<1$ and $0\leq z<1$.

16. The method according to claim 1, wherein the first metallic layer, the barrier layer and the second metallic layer are stacked above one another in the order indicated and are in direct contact to one another.

17. The method according to claim 1, wherein the second metallic layer comprises the indium-tin alloy of the formula $In_xSn_{1-x}$ with $0.04\leq x\leq 0.2$, wherein the barrier layer comprises $Ti_yW_{y-1}$ or $Ti_zN_{z-1}$, wherein $0\leq y<1$ and $0\leq z<1$, and wherein the first metallic layer, the barrier layer and the second metallic layer are stacked above one another in the order indicated and are in direct contact to one another.

18. An electronic component comprising:
a substrate; and
a semiconductor chip arranged above the substrate,
wherein a bonding layer sequence is arranged between the substrate and the semiconductor chip, the bonding layer sequence comprising:
- a first intermetallic layer comprising indium, tin and nickel;
- a second intermetallic layer comprising indium, tin and a titanium compound, or indium, tin and nickel, or indium, tin and platinum, or indium, tin and titanium; and
- a third intermetallic layer comprising indium, tin and gold,
wherein in the third intermetallic layer an amount of substance of gold is greater than an amount of substance of tin, and
wherein the first intermetallic layer is arranged above the substrate, the second intermetallic layer is arranged above the first intermetallic layer and the third intermetallic layer is arranged above the second intermetallic layer.

19. The electronic component according to claim 18, wherein the third intermetallic layer comprises a gold-tin alloy of a zeta phase.

* * * * *